(12) United States Patent
Choi

(10) Patent No.: US 7,182,819 B2
(45) Date of Patent: Feb. 27, 2007

(54) METHODS FOR CLEANING A CHAMBER OF SEMICONDUCTOR DEVICE MANUFACTURING EQUIPMENT

(75) Inventor: Seung Chul Choi, Gyeonggi-do (KR)

(73) Assignee: Dongbu Electronics Co., Ltd., Seoul (KR)

( * ) Notice: Subject to any disclaimer, the term of this patent is extended or adjusted under 35 U.S.C. 154(b) by 0 days.

(21) Appl. No.: 11/027,086

(22) Filed: Dec. 29, 2004

(65) Prior Publication Data

US 2005/0139232 A1    Jun. 30, 2005

(30) Foreign Application Priority Data

Dec. 31, 2003    (KR)    ...................... 10-2003-0101191

(51) Int. Cl.
*B08B 7/04* (2006.01)

(52) U.S. Cl. ................... 134/18; 134/22.18; 134/22.1; 134/902; 156/345.24; 156/345.25; 156/345.5; 156/345.26; 438/905

(58) Field of Classification Search ............... 134/18, 134/56 R, 22.1, 22.18, 902, 1; 216/59, 60; 438/905; 156/345.24, 345.25, 345.5, 345.26
See application file for complete search history.

(56) References Cited

U.S. PATENT DOCUMENTS

| | | | |
|---|---|---|---|
| 5,290,383 A | | 3/1994 | Koshimizu .................. 156/345 |
| 5,902,403 A | * | 5/1999 | Aitani et al. ................. 118/715 |
| 6,186,154 B1 | | 2/2001 | Huang ......................... 134/1.1 |
| 6,192,898 B1 | * | 2/2001 | Aitani et al. ................. 134/1.1 |
| 6,482,746 B2 | | 11/2002 | Vasudev et al. ............. 438/714 |
| 6,635,144 B2 | | 10/2003 | Cui et al. .............. 156/345.25 |
| 6,664,119 B2 | | 12/2003 | Choi et al. ..................... 438/14 |
| 6,843,881 B2 | * | 1/2005 | Kim et al. ............. 156/345.25 |
| 2002/0117472 A1 | * | 8/2002 | Sun et al. ...................... 216/68 |
| 2002/0195124 A1 | | 12/2002 | Chin et al. .................... 134/18 |
| 2003/0036272 A1 | | 2/2003 | Shamoulian et al. ....... 438/691 |
| 2003/0216041 A1 | | 11/2003 | Herring et al. ............. 438/689 |

FOREIGN PATENT DOCUMENTS

KR    10-2001-0004243    1/2001

* cited by examiner

*Primary Examiner*—M. Kornakov
(74) *Attorney, Agent, or Firm*—Saliwanchik, Lloyd & Saliwanchik

(57) ABSTRACT

Methods for cleaning a chamber of semiconductor device manufacturing equipment are disclosed. An illustrated method comprises supplying cleaning gas into a chamber to start a cleaning process; detecting the intensity of a wavelength for the cleaning gas; fixing a valve at a predetermined position to control the pressure in the chamber; detecting the pressure in the chamber during some period of the cleaning time, the cleaning time being from the beginning of the cleaning process to the time when the intensity of the wavelength is settled at a predetermined value; and stopping supplying the cleaning gas into the chamber to complete the cleaning process.

5 Claims, 2 Drawing Sheets

(Prior Art)

METHODS FOR CLEANING A CHAMBER OF SEMICONDUCTOR DEVICE MANUFACTURING EQUIPMENT

FIELD OF THE DISCLOSURE

The present disclosure relates generally to semiconductor device fabrication and, more particularly, to methods for cleaning a chamber of semiconductor device manufacturing equipment.

BACKGROUND

In fabricating a semiconductor device, a process of depositing a film on a wafer is performed in a chamber. During the deposition process, the material to form the film are deposited on the inside walls of the chamber as well as on the wafer thereby forming an undesired film on the chamber walls. If a sufficient amount of the undesired film is deposited on the chamber walls, the particles of the undesired film may fall from the inside walls of the chamber onto the wafer, thereby causing defects in the wafer or in a device fabricated on the wafer. To obviate the possibility of falling particles from the undesired film causing defects, a cleaning process is periodically performed wherein clean gas supplied into the chamber to remove the undesired film in the chamber. The type of clean gas is selected based on the type and the thickness of the undesired film deposited in the chamber. The cleaning process is performed until the undesired film in the chamber is completely removed. The time spent attempting to remove an undesired film in a chamber is defined as clean time. The clean time is the most important factor in performing a cleaning process. If the clean time is too short, the undesired film in the chamber may not be completely removed. On the contrary, if the clean time is too long, the inside walls of the chamber may be damaged.

A conventional cleaning process is performed at a constant pressure in a chamber. The clean time is determined by using an endpoint detector. The endpoint detector detects the intensity of a specific wavelength of the cleaning gas. When the intensity of the wavelength detected by the endpoint detector is stabilized, the cleaning process is finished.

FIG. 1 is a graph illustrating wavelengths detected by an endpoint detector. Referring to FIG. 1, the end point of a cleaning process occurs when a concentration trend is stabilized.

Korean patent publication number 10-2001-0004243, which is assigned to Hynix Semiconductor Inc., describes a method for cleaning a plasma chamber of semiconductor device manufacturing equipment. The described method of cleaning a plasma chamber includes performing a polysilicon etch-back process within a plasma chamber, flowing mixed gas into the plasma chamber to form a plasma for chamber cleaning, and performing a plasma cleaning to remove a polymer from the inner wall of the plasma chamber. The plasma cleaning process is performed without unloading a run wafer and with the bottom bias power set at 1~800 W, and by applying a top power at 1000~3000 W.

This conventional cleaning technology determines the clean time by using an endpoint detector which detects the intensity of a specific wavelength for the cleaning gas. However, when residual products generated during the cleaning process influence the intensity of the wavelength or when the position of the endpoint detector is changed, the cleaning process may not be sufficiently performed.

DETAILED DESCRIPTION

Figure 1:
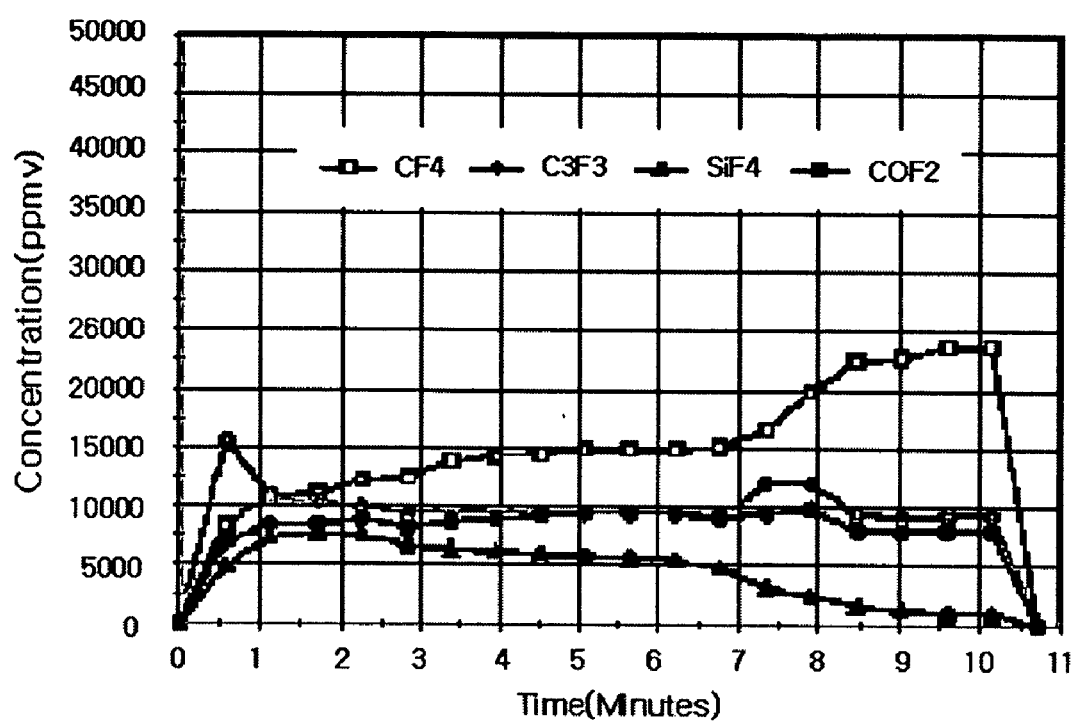
FIG. 1 is a graph illustrating wavelengths detected by an endpoint detector.
Figure 2:
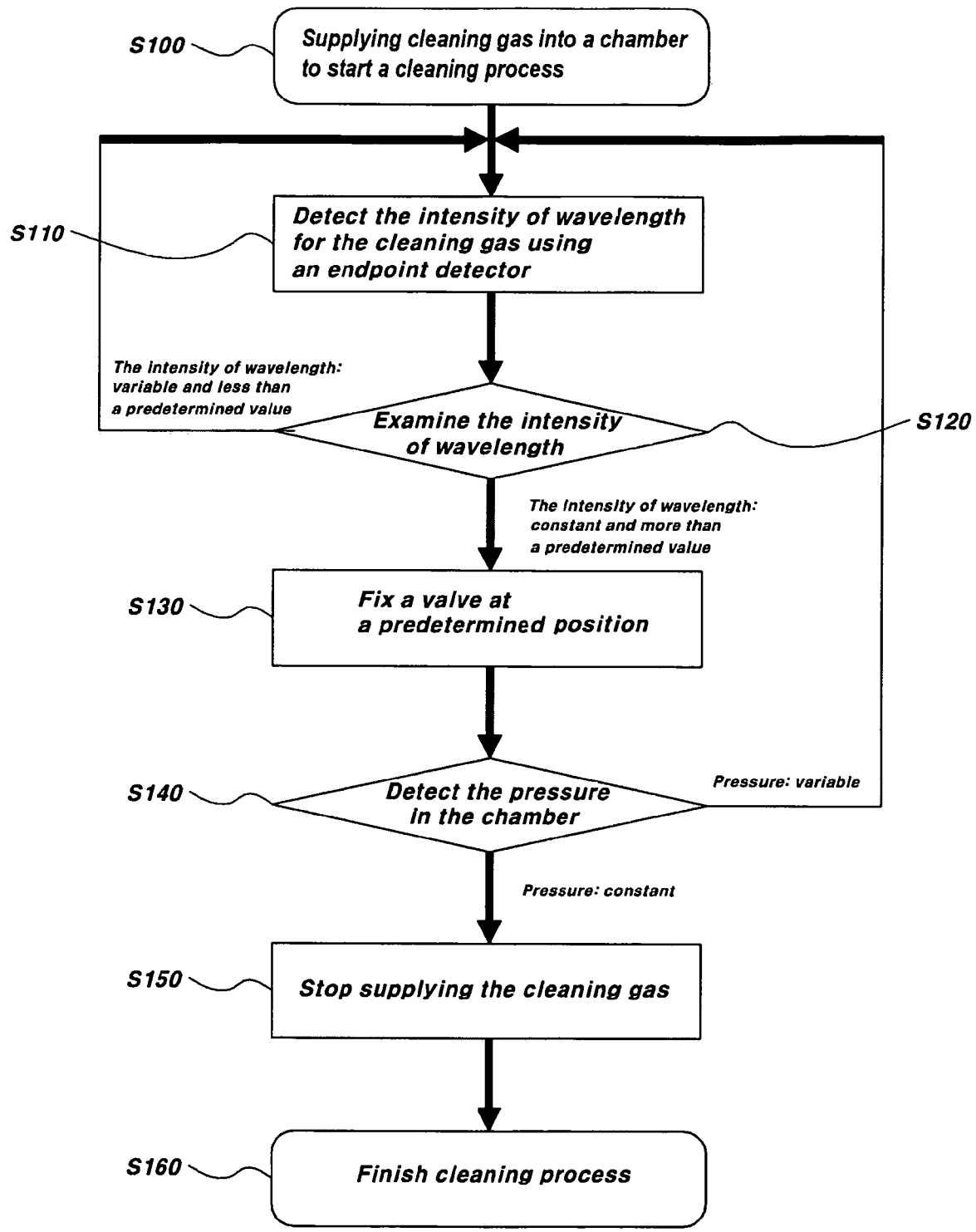
FIG. 2 is a flowchart illustrating an example process of cleaning a chamber of semiconductor device manufacturing equipment performed in accordance with the teachings of the present invention.

FIG. 2 is a flowchart illustrating an example process of cleaning a chamber of semiconductor device manufacturing equipment. In the illustrated process, the intensity of a wavelength of a specific atom and the pressure in a chamber are both detected and these measurements are used to control a cleaning process.

Referring to FIG. 2, after a deposition process is completed in a process chamber, a cleaning gas is supplied into the chamber to begin a cleaning process (S100). An endpoint detector detects the intensity of a specific wavelength of the cleaning gas (S110). The intensity of the wavelength detected is examined and compared with a predetermined value (S120). If the detected value is higher than the predetermined value and constantly maintained for a predetermined time period, a valve to control the pressure in the chamber is fixed at a predetermined position (S130). If the detected value is changing and less than the predetermined value, additional cleaning gas is supplied into the chamber and the cleaning process returns to block S100. In the illustrated process, the valve to control the pressure in the chamber should not be completely closed because the chamber may be damaged due to the continuously supplied cleaning gas and the residual products caused by the cleaning if the chamber is completely closed. The pressure in the chamber is detected during some period of the cleaning process (S140). For example, the pressure in the chamber is detected for 10% of the period from the beginning of the cleaning process to the time when the intensity of wavelength is settled at the predetermined value. If the detected pressure is fluctuating with the passage of time, additional cleaning gas is supplied into the chamber and the cleaning process returns to block S100. If the detected pressure is constant for the passage of a predetermined time period, the supply of the cleaning gas is stopped (S150) to complete the cleaning process (S160).

From the foregoing, persons of ordinary skill in the art will appreciate that, by detecting both the intensity of a wavelength for the cleaning gas and the pressure in a chamber, the disclosed methods for cleaning a chamber of semiconductor device manufacturing equipment can perform a correct cleaning based on the state of the chamber, thereby avoiding the waste of cleaning gas and preventing damage of the chamber due to over-cleaning. Moreover, the disclosed processes prevent defects due to particles caused by incomplete cleaning, thereby increasing the yield of devices subsequently manufactured in the chamber.

It is noted that this patent claims priority from Korean Patent Application Serial Number 10-2003-0101191, which was filed on Dec. 31, 2004, and is hereby incorporated by reference in its entirety.

Although certain example methods, apparatus and articles of manufacture have been described herein, the scope of coverage of this patent is not limited thereto. On the contrary, this patent covers all methods, apparatus and articles of manufacture fairly falling within the scope of the appended claims either literally or under the doctrine of equivalents.

What is claimed is:

1. A method for cleaning a chamber of semiconductor device manufacturing equipment comprising:
   supplying cleaning gas into the chamber to start a cleaning process;
   detecting an intensity of a wavelength for the cleaning gas;
   fixing a valve to control a pressure in the chamber at a predetermined position when the intensity of the wavelength exhibits a predetermined condition, wherein the predetermined condition is that the intensity of the detected wavelength is higher then a predetermined value and substantially constant for a predetermined duration;
   detecting the pressure in the chamber during a time period while the intensity of the wavelength exhibits the predetermined condition, wherein detecting the pressure in the chamber during a time period is performed during about 10% of a cleaning time, wherein the cleaning time is the time from when the cleaning process starts to when the intensity of wavelength is settled at the predetermined value; and
   stopping the supply of the cleaning gas into the chamber to complete the cleaning process when the detected pressure meets a predetermined criterion.

2. The method as defined by claim 1, where the valve is fixed without completely closing the chamber.

3. The method as defined by claim 1, wherein the predetermined criterion comprises maintaining the detected pressure in the chamber substantially constant for a predetermined period of time.

4. A method as defined by claim 1, further comprising supplying additional cleaning gas into the chamber to restart the cleaning process if the detected pressure is fluctuating with the time period.

5. The method as defined by claim 1, further comprising supplying additional cleaning gas into the chamber to restart the cleaning process if the intensity of the detected wavelength is changing and less than the predetermined value.

* * * * *